US009824954B2

(12) United States Patent
Kamiya (10) Patent No.: US 9,824,954 B2
(45) Date of Patent: Nov. 21, 2017

(54) SEMICONDUCTOR PACKAGE COMPRISING STACKED INTEGRATED CIRCUIT CHIPS HAVING CONNECTION TERMINALS AND THROUGH ELECTRODES SYMMETRICALLY ARRANGED

(71) Applicant: CANON KABUSHIKI KAISHA, Tokyo (JP)

(72) Inventor: Takayuki Kamiya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 353 days.

(21) Appl. No.: 14/270,032

(22) Filed: May 5, 2014

(65) Prior Publication Data

US 2014/0332930 A1    Nov. 13, 2014

(30) Foreign Application Priority Data

May 10, 2013    (JP) ................. 2013-100708

(51) Int. Cl.
*H01L 25/065*    (2006.01)
*H01L 23/50*    (2006.01)
(Continued)

(52) U.S. Cl.
CPC .......... *H01L 23/481* (2013.01); *H01L 24/81* (2013.01); *H01L 24/92* (2013.01);
(Continued)

(58) Field of Classification Search
CPC ............... H01L 25/0657; H01L 23/50; H01L 2224/16146
See application file for complete search history.

(56) References Cited

U.S. PATENT DOCUMENTS

2011/0309468 A1* 12/2011 Oh .............. H01L 24/94
257/508
2014/0089609 A1* 3/2014 Kegel .......... H01L 23/49827
711/154

FOREIGN PATENT DOCUMENTS

| JP | 2010-109264 A | 5/2010 |
| JP | 2013-033999 A | 2/2013 |
| WO | 2011/030467 A1 | 3/2011 |

OTHER PUBLICATIONS

The above foreign patent documents were cited in the Feb. 3, 2017 Japanese Office Action, which is enclosed without an English Translation, that issued in Japanese Patent Application No. 2013100708.

* cited by examiner

*Primary Examiner* — Marcos D Pizarro
(74) *Attorney, Agent, or Firm* — Cowan, Liebowitz & Latman, P.C.

(57) ABSTRACT

An integrated circuit device comprises N stacked first integrated circuit chips each of which includes a first circuit and N stacked second integrated circuit chips each of which includes a second circuit. The N stacked second integrated circuit chips are stacked on the N stacked first integrated circuit chips. A first and second integrated circuit chips at symmetric positions with respect to a reference surface are paired. Each of the first and second integrated circuit chips include connection terminals for connecting the first circuit of the first integrated circuit chip and the second circuit of the second integrated circuit chip in the pair, and through electrodes each penetrating an inside of the chip. The connection terminals and through electrodes are arranged to be symmetric with respect to the reference surface.

7 Claims, 5 Drawing Sheets

(51) Int. Cl.
*H01L 23/48* (2006.01)
*H01L 23/00* (2006.01)
(52) U.S. Cl.
CPC .......... *H01L 25/0657* (2013.01); *H01L 23/50* (2013.01); *H01L 24/13* (2013.01); *H01L 24/16* (2013.01); *H01L 2224/13025* (2013.01); *H01L 2224/16145* (2013.01); *H01L 2224/16146* (2013.01); *H01L 2224/16225* (2013.01); *H01L 2224/85* (2013.01); *H01L 2924/00014* (2013.01)

SEMICONDUCTOR PACKAGE COMPRISING STACKED INTEGRATED CIRCUIT CHIPS HAVING CONNECTION TERMINALS AND THROUGH ELECTRODES SYMMETRICALLY ARRANGED

BACKGROUND OF THE INVENTION

Field of the Invention

The present invention relates to an integrated circuit device and a configuration method thereof.

Description of the Related Art

As a technique of stacking a plurality of semiconductor integrated circuit chips to increase the packaging density of semiconductor integrated circuit chips, for example, techniques called PoP (Package on Package) and CoC (Chip on Chip) have already been put into practical use. However, in conventional PoP or CoC, general means such as a bonding wire and interposer are used to connect semiconductor integrated circuit chips to each other. The parasitic capacitances of these means hinder a high-speed operation.

To solve this problem, a technique called TSV (Through Silicon Via) using wiring and electrodes which penetrate the inside of chips is proposed as another technique of connecting stacked semiconductor integrated circuit chips to each other (see, for example, Japanese Patent Laid-Open No. 2010-109264). By using TSV, semiconductor integrated circuit chips are connected to each other by a shortest distance. Thus, a small parasitic capacitance, high-speed operation, and low power consumption can be implemented.

In an electronic device such as a compact digital camera, a dual processor system in which two system LSI chips are mounted on a motherboard is sometimes built to improve the arithmetic processing capability. Note that a system LSI chip includes a processor such as a CPU, and a memory controller. As a temporary storage area, the system LSI chip requires a memory such as a DRAM (Dynamic Random Access Memory). To operate respective processors in parallel, memories corresponding to respective system LSI chips are necessary. As building components, the dual processor system requires, for example, two system LSI chips and two memory chips each including a memory core, that is, a total of four semiconductor integrated circuit chips.

To increase the packaging density, there is a demand to implement one stacked dual processor package in which two system LSI chips and two memory chips, that is, a total of four chips are stacked by the above-mentioned TSV technique in the dual processor system.

However, when a plurality of system LSI chips having the same structure and a plurality of memory chips having the same structure are stacked using the TSV technique, a plurality of memory controllers and a plurality of memory cores are connected to a common bus, causing bus collision. As a result, the respective memory controllers cannot access the paired memory cores in parallel, degrading the processing performance.

There is also a device which does not require so high processing performance as to mount a stacked dual processor package, and mounts a stacked single processor package in which one system LSI chip and one memory chip are stacked. In this case, it is desirable in terms of the production cost to divert common chips for a stacked dual processor package and stacked single processor package.

SUMMARY OF THE INVENTION

The present invention has been made in consideration of the aforementioned problems, and realizes a technique capable of diverting common chips even when paired first integrated circuit chips and second integrated circuit chips are connected separately and the number of stacked chips is changed in an arrangement in which first integrated circuit chips and second integrated circuit chips are stacked by the same number.

In order to solve the aforementioned problems, the present invention provides an integrated circuit device comprising: N (N is a natural number of not less than 2) stacked first integrated circuit chips each configured to include a first circuit; and N stacked second integrated circuit chips each configured to include a second circuit, wherein the N stacked second integrated circuit chips are stacked on the N stacked first integrated circuit chips, a first integrated circuit chip and a second integrated circuit chip at symmetric positions with respect to a reference surface, which is a surface on which the first integrated circuit chip and the second integrated circuit chip are adjacent to each other, are paired, each of the first integrated circuit chips and each of the second integrated circuit chips include connection terminals for connecting the first circuit of the first integrated circuit chip and the second circuit of the second integrated circuit chip in the pair, and through electrodes each penetrating an inside of the chip, and the connection terminals and the through electrodes in the first integrated circuit chip and the second integrated circuit chip are arranged to be symmetric with respect to the reference surface.

In order to solve the aforementioned problems, the present invention provides an integrated circuit device comprising: N stacked first integrated circuit chips each configured to include a first circuit; and N stacked second integrated circuit chips each configured to include a second circuit, wherein the N stacked second integrated circuit chips are stacked on the N stacked first integrated circuit chips, at least X (N≤X) first connection portions are arranged on each of a first surface of the first integrated circuit chip and the first surface of the second integrated circuit chip, and at least X second connection portions are arranged on each of a second surface of the first integrated circuit chip and the second surface of the second integrated circuit chip, the first connection portions are arranged on the first surface and the second connection portions are arranged on the second surface to connect Yth (1≤Y≤X) first connection portions and Yth second connection portions on the N stacked first integrated circuit chips and the N stacked second integrated circuit chips, a first one of the first connection portions is connected to the first circuit in each of the N first integrated circuit chips, and a Zth (2≤Z≤X) one of the first connection portions is connected to a (Z−1)th one of the second connection portions via a through electrode formed in an inside of the first integrated circuit chip, a first one of the second connection portions is connected to the second circuit in each of the N second integrated circuit chips, and a Zth (2≤Z≤X) one of the first connection portions is connected to a (Z−1)th one of the first connection portions via a through electrode formed in an inside of the second integrated circuit chip, and a Yth one of the second connection portions in the second integrated circuit chip adjacent to the first integrated circuit chip and a Yth one of the first connection portions in the first integrated circuit chip adjacent to the second integrated circuit chip are connected.

In order to solve the aforementioned problems, the present invention provides a method of configuring an integrated circuit device by stacking N (N is a natural number of not less than 2) first integrated circuit chips each including a first circuit, and further stacking N second integrated circuit chips each including a second circuit on the stacked first integrated circuit chips, comprising: pairing a first integrated circuit chip and a second integrated circuit chip at symmetric positions with respect to a reference surface which is a surface on which the first integrated circuit chip and the second integrated circuit chip are adjacent to each other; and connecting the first circuit of the first integrated circuit chip and the second circuit of the second integrated circuit chip, which are paired, by connection terminals arranged to be symmetric with respect to the reference surface on the first integrated circuit chip and the second integrated circuit chip, and through electrodes each penetrating an inside of the chip.

According to the present invention, common chips can be diverted even when paired first integrated circuit chips and second integrated circuit chips are connected separately and the number of stacked chips is changed in an arrangement in which first integrated circuit chips and second integrated circuit chips are stacked by the same number.

Further features of the present invention will become apparent from the following description of exemplary embodiments (with reference to the attached drawings).

DESCRIPTION OF THE EMBODIMENTS

Embodiments of the present invention will be described in detail below. The following embodiments are merely examples for practicing the present invention. The embodiments should be properly modified or changed depending on various conditions and the structure of an apparatus to which the present invention is applied. The present invention should not be limited to the following embodiments.

First Embodiment

First, a semiconductor integrated circuit device and integrated circuit chip stacking method according to the first embodiment will be described with reference to FIGS. 1 and 2. In the following description, in a plurality of semiconductor integrated circuit chips stacked on a support substrate, a surface on a side near the support substrate will be defined as a lower surface, and a surface on a far side will be defined as an upper surface. In two stacked semiconductor integrated circuit chips, a chip on a side near the support substrate will be defined as a lower layer, and a chip on a far side will be defined as an upper layer.

In the embodiment, a system LSI chip includes a processor such as a CPU, and a memory controller. As a temporary storage area, the system LSI chip requires a memory such as a DRAM (Dynamic Random Access Memory). To operate respective processors in parallel, memories corresponding to respective system LSI chips are necessary. As building components, the dual processor system requires, for example, two system LSI chips and two memory chips each including a memory core, that is, a total of four semiconductor integrated circuit chips.

Figure 1:
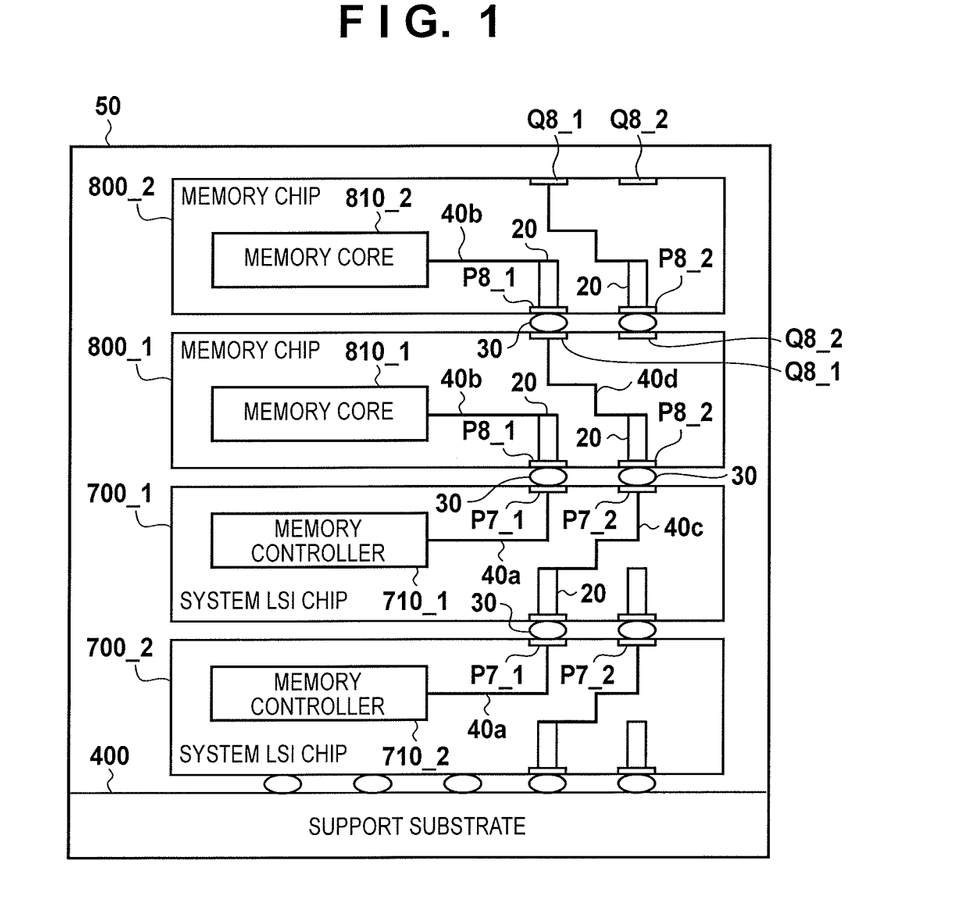
FIG. 1 is a view exemplifying the configuration of a stacked dual processor package according to the first embodiment.

FIG. 1 exemplifies the configuration of a stacked dual processor package according to the embodiment. A stacked dual processor package 50 is configured by stacking two system LSI chips 700 having the same structure on a support substrate 400, and further stacking, on the upper layer, memory chips 800 having the same structure, which are equal in number to the system LSI chips 700. A surface on which the first system LSI chip 700_1 and memory chip 800_1 are adjacent to each other is defined as a reference surface. The first system LSI chip 700 counted from the reference surface will be referred to as the system LSI chip 700_1, and the second system LSI chip 700 will be referred to as the system LSI chip 700_2. Similarly, the first memory chip 800 counted from the reference surface between the first system LSI chip 700_1 and the memory chip 800_1 will be referred to as the memory chip 800_1, and the second memory chip 800 will be referred to as the memory chip 800_2. FIG. 1 is a sectional view of the package 50 in which the two system LSI chips 700 and the two memory chips 800 are stacked, when viewed from a lateral direction perpendicular to the stacking direction. In the embodiment, the system LSI chips 700 and memory chips 800 are configured to have substantially the same shapes and areas when viewed from the top, respectively.

The support substrate 400 functions as a rewiring substrate which gives physical strength to stacked semiconductor integrated circuit chips and increases the terminal pitch of the stacked system LSI chip 700_2.

Each system LSI chip 700 includes a memory controller 710, and two connection terminals P7_1 and P7_2 are arranged on the upper surface of the system LSI chip 700. The respective LSI chips 700_1 and 700_2 include the memory controllers 710_1 and 710_2 for controlling the memory chips 800_1 and 800_2. In addition to the memory controllers 710_1 and 710_2, the respective system LSI chips 700_1 and 700_2 include various processing circuits, CPUs, and the like. In accordance with control instructions from these processing circuits and CPUs, the respective memory controllers 710_1 and 710_2 access memory cores 810_1 and 810_2 of the memory chips 800_1 and 800_2 to write and read out data.

The memory controller 710 of the system LSI chip 700_1 will be referred to as the memory controller 710_1, and the memory controller 710 of the system LSI chip 700_2 will be referred to as the memory controller 710_2. In each of the system LSI chips 700_1 and 700_2, the connection terminal P7_1 is electrically connected to the memory controller 710 via an internal wiring 40a. The connection terminal P7_2 of the system LSI chip 700_1 is connected via an internal wiring 40c to a through electrode (to be referred to as a TSV hereinafter) 20 which penetrates the inside of the chip. The TSV 20 is arranged at a predetermined position on the lower surface of the system LSI chip 700_1 so that the TSV 20 is electrically connected to the connection terminal P7_1 of the system LSI chip 700_2 via a microbump 30. The connection terminal P7_2 is arranged at a predetermined position on the upper surface of the system LSI chip 700_1 so that the connection terminal P7_2 is electrically connected to a connection terminal P8_2 of the memory chip 800_1.

The respective memory chips 800_1 and 800_2 include the memory cores 810_1 and 810_2 such as DRAMs, and two connection terminals P8_1 and P8_2 are arranged on the lower surface of each memory chip. The memory core 810 of the first memory chip 800_1 will be referred to as the memory core 810_1, and the memory core 810 of the second memory chip 800_2 will be referred to as the memory core 810_2. In each memory chip 800, the first connection terminal P8_1 is electrically connected to the memory core 810 via the TSV 20 and an internal wiring 40*b*. The connection terminal P8_2 of the first memory chip 800_1 is electrically connected to the connection terminal P8_1 of the memory chip 800_2 on the upper layer via the TSV 20, an internal wiring 40*d*, a connection pad Q8_1, and the microbump 30.

The connection terminal P7_1 and connection terminal P8_1, and the connection terminal P7_2 and connection terminal P8_2 are electrically connected via the microbumps 30, respectively, between the system LSI chip 700_1 and the memory chip 800_1 which are stacked to be adjacent to each other. More specifically, the connection terminal P8_1 is arranged at a predetermined position on the lower surface of the memory chip 800_1 so that the connection terminal P8_1 is electrically connected to the connection terminal P7_1. Also, the connection terminal P8_2 is arranged at a predetermined position on the lower surface of the memory chip 800_1 so that the connection terminal P8_2 is electrically connected to the connection terminal P7_2.

In this example, two connection terminals are arranged on the upper surface of each of the system LSI chips 700_1 and 700_2, and two connection terminals are arranged on the lower surface of each of the memory chips 800_1 and 800_2. In practice, however, three or more connection terminals may be arranged. FIG. 1 shows one internal wiring and one TSV for connecting each of the memory controllers 710_1 and 710_2 and each of the memory cores 810_1 and 810_2. In practice, however, the internal wiring and TSV are buses each formed from a plurality of lines, and a plurality of corresponding connection terminals exist.

As shown in FIG. 1, the memory controller 710_1 and memory core 810_1 are connected, and the memory controller 710_2 and memory core 810_2 are connected. The memory controller 710_1 and memory core 810_1 form the first pair, and the memory controller 710_2 and memory core 810_2 form the second pair. The first and second pairs are connected separately without bus collision. That is, the respective memory controllers 710_1 and 710_2 can separately access the corresponding memory cores 810_1 and 810_2 to perform processes in parallel.

Next, a case in which one system LSI chip and one memory chip shown in FIG. 1 are stacked will be explained with reference to FIG. 2.

Figure 2:
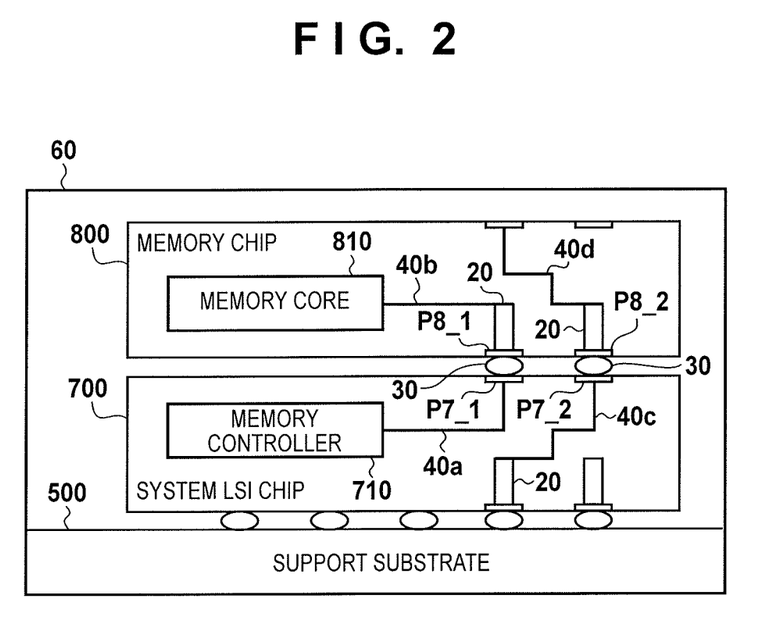
FIG. 2 is a view exemplifying the configuration of a stacked single processor package for which the chips of the stacked dual processor package shown in FIG. 1 are diverted.

FIG. 2 exemplifies the configuration of a stacked single processor package 60 for which the system LSI chip 700 and memory chip 800 of the stacked dual processor package 50 shown in FIG. 1 are diverted. Note that the same reference numerals as those in FIG. 1 denote the same parts, and a description thereof will not be repeated.

The stacked single processor package 60 is configured by stacking the system LSI chip 700 on a support substrate 500, and further stacking the memory chip 800 on the upper layer of the chip 700.

The support substrate 500 functions as a rewiring substrate which gives physical strength to stacked semiconductor integrated circuit chips and increases the terminal pitch of the stacked system LSI chip 700.

The first system LSI chip 700 and memory chip 800 are stacked to be adjacent to each other, and the connection terminal P7_1 and connection terminal P8_1 are electrically connected via the microbump 30.

As described above, two system LSI chips 700 (first semiconductor integrated circuit chips) are stacked on the support substrate 400. The memory chips 800 (second semiconductor integrated circuit chips) equal in number to the system LSI chips 700 are further stacked on the upper layer of the chips 700. Chips at symmetric positions with respect to a reference surface, which is a surface on which the first system LSI chip 700_1 and memory chip 800_1 are adjacent to each other, are paired and electrically connected by internal wirings and TSVs. Further, the internal wirings and TSVs which connect the memory controller 710_1 and memory core 810_1 to be paired and the memory controller 710_2 and memory core 810_2 to be paired are configured to be symmetric with respect to the reference surface, thereby separately connecting the chips to be paired. As a result, the system LSI chip 700 and memory chip 800 of the stacked dual processor package 50 in FIG. 1 can be diverted for even the single processor package 60 in FIG. 2. Commonality of the manufacturing process can reduce the production cost.

Second Embodiment

A semiconductor integrated circuit device and integrated circuit chip stacking method according to the second embodiment will be described with reference to FIGS. 3 and 4 by exemplifying a case in which N (N 3; N is a natural number) system LSI chips and N memory chips are stacked.

Figure 3:
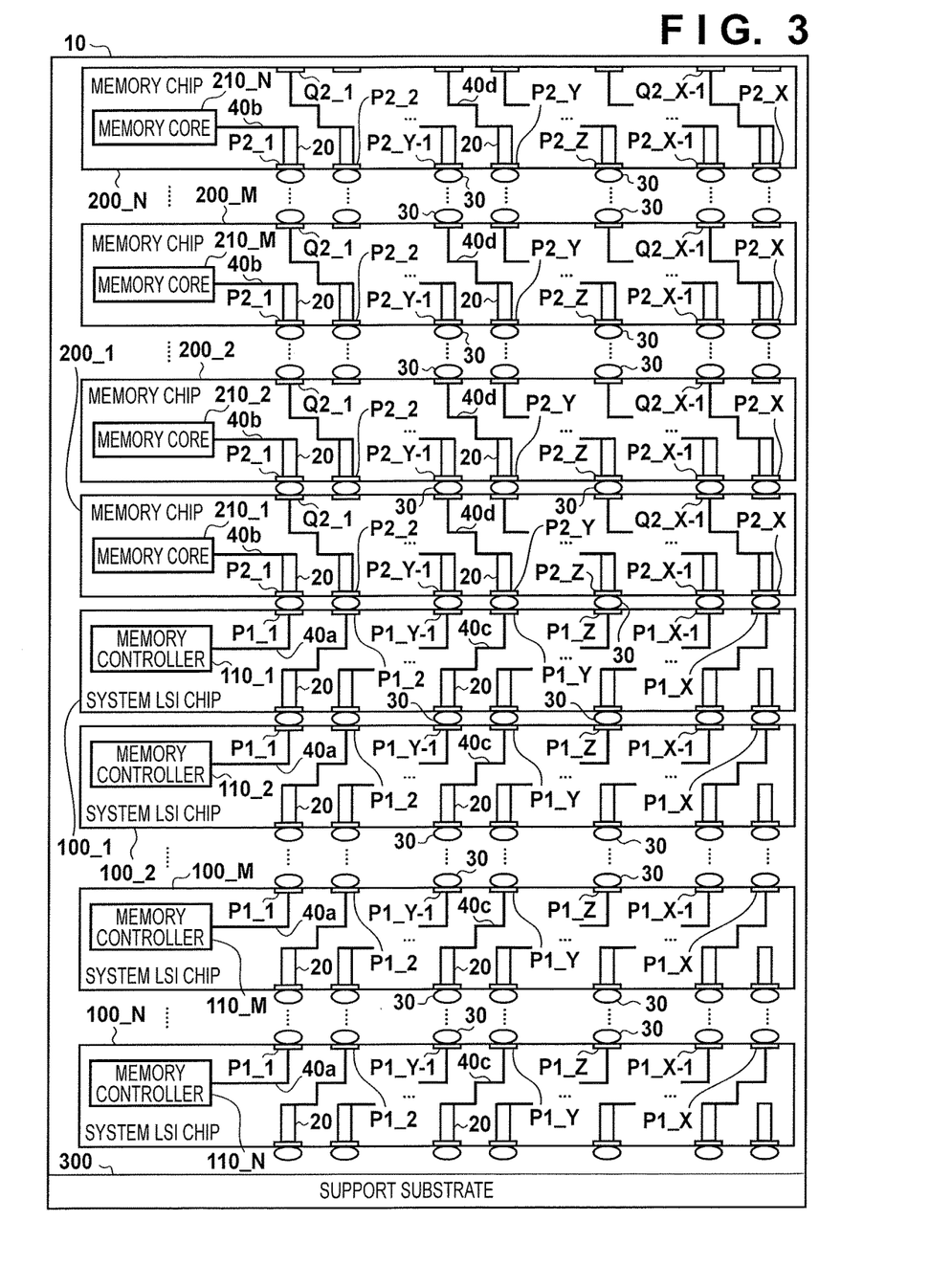
FIG. 3 is a view exemplifying the configuration of a stacked multiprocessor package according to the second embodiment.

FIG. 3 exemplifies the configuration of a stacked multiprocessor package in which N (N≥3; N is a natural number) system LSI chips and N memory chips are stacked. A stacked multiprocessor package 10 according to the embodiment is configured by stacking N system LSI chips 100 having the same structure on a support substrate 300, and further stacking, on the upper layer, N memory chips 200 having the same structure.

A surface on which the first system LSI chip 100_1 and memory chip 200_1 are adjacent to each other is defined as a reference surface. The Mth system LSI chip 100 counted from the reference surface will be referred to as the system LSI chip 100_M. Similarly, the Mth memory chip 200 counted from the reference surface between the first system LSI chip 100_1 and the first memory chip 200_1 will be referred to as the memory chip 200_M. In this case, M=1, 2, . . . , N (M is a natural number of 1 or more).

The support substrate 300 functions as a rewiring substrate which gives physical strength to stacked semiconductor integrated circuit chips and increases the terminal pitch of the stacked system LSI chip 100_N.

Each system LSI chip 100_N incorporates a memory controller 110_N, and X (X≥N) connection terminals P1_1, P1_2, . . . , P1_X are arranged on the upper surface. The memory controller 110 inside the system LSI chip 100_M will be referred to as the memory controller 110_M. In each system LSI chip 100_N, the first connection terminal P1_1 is electrically connected to the memory controller 110_N via an internal wiring 40*a*. The Yth connection terminal P1_Y on the upper layer is electrically connected to the (Y−1)th connection terminal P1_Y−1 on the lower surface via an internal wiring 40*c*, TSV 20, and microbump 30 between the Nth system LSI chip 100_N and (N−1)th system LSI chip 100_N−1 which are stacked to be adjacent to each other. In this case, Y=2, 3, . . . , X (Y is a natural number of 2 (inclusive) to X (inclusive)).

Each memory chip 200_N incorporates a memory core 210_N, and X (X≥N) connection terminals P2_1, P2_2, . . . , P2_X are arranged on the lower surface. The memory core 210 inside the memory chip 200_M will be referred to as the memory core 210_M. In each memory chip 200_N, the first connection terminal P2_1 is electrically connected to the memory core 210_N via the TSV 20 and an internal wiring 40b.

The Yth connection terminal P2_Y on the lower surface of a lower layer-side chip is connected to the (Y−1)th connection terminal P2_Y−1 on the lower surface of an upper layer-side chip via the TSV 20, an internal wiring 40d, and the microbump 30 between the Nth memory chip 200_N and (N−1)th memory chip 200_N−1 which are stacked to be adjacent to each other. In this case, Y=2, 3, . . . , X (Y is a natural number of 2 (inclusive) to X (inclusive)).

The Zth connection terminal P1_Z and connection terminal P2_Z are electrically connected via the microbump 30 between the first system LSI chip 100_1 and the first memory chip 200_1 which are stacked to be adjacent to each other. In this case, Z=1, 2, . . . , X (Z is a natural number of 1 (inclusive) to X (inclusive)).

Note that one internal wiring and one TSV for connecting the memory controller 110_N and memory core 210_N are illustrated. In practice, however, the internal wiring and TSV are buses each formed from a plurality of lines, and a plurality of corresponding connection terminals exist.

In the above-described configuration, all pairs of the memory controllers 110_M and corresponding memory cores 210_M are connected separately without bus collision. That is, the respective memory controllers 110_N can separately access the corresponding memory cores 210_N to perform processes in parallel.

Next, a case in which the system LSI chip 100 and memory chip 200 in FIG. 3 are diverted and the number of stacked chips is changed will be explained with reference to FIGS. 4A-4C. Note that the same reference numerals as those in FIG. 3 denote the same parts, and a description thereof will not be repeated.

Figure 4A:
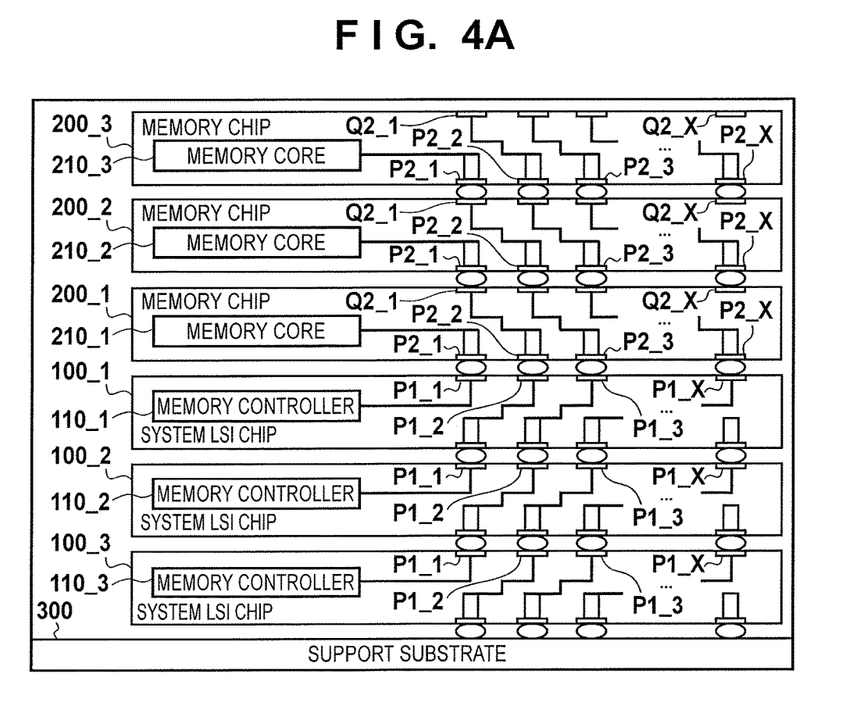
FIGS. 4A-4C are views exemplifying the configuration of a package for which the chips of the stacked multiprocessor package shown in FIG. 3 are diverted and the number of stacked chips is changed.

FIG. 4A exemplifies a configuration in which three system LSI chips 100 and three memory chips 200 in the stacked multiprocessor package shown in FIG. 3 are stacked. In FIG. 4A, a memory controller 110_1 and memory core 210_1, a memory controller 110_2 and memory core 210_2, and a memory controller 110_3 and memory core 210_3 are connected separately as pairs.

Figure 4B:
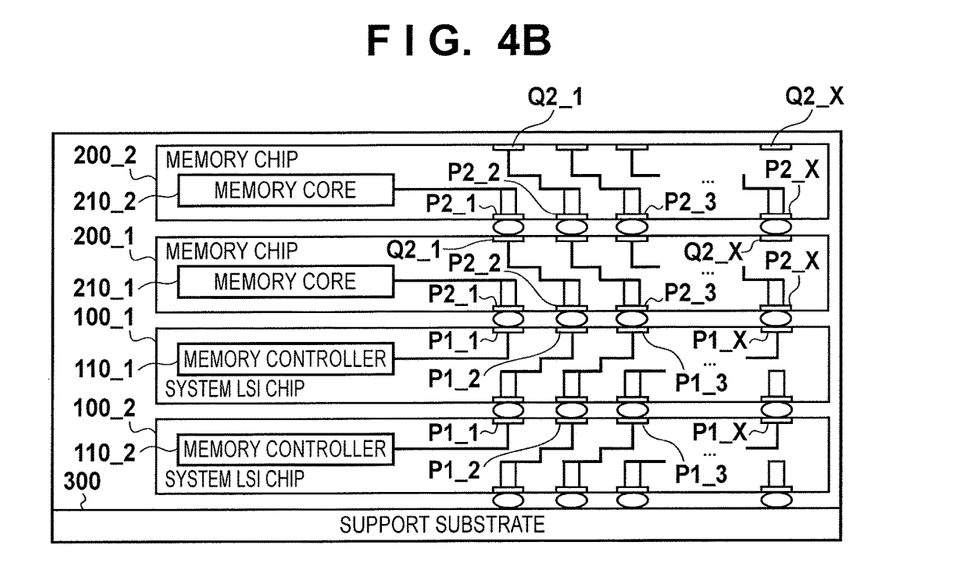

FIG. 4B exemplifies a configuration in which two system LSI chips 100 and two memory chips 200 in the stacked multiprocessor package shown in FIG. 3 are stacked. In FIG. 4B, the memory controller 110_1 and memory core 210_1, and the memory controller 110_2 and memory core 210_2 are connected separately as pairs.

Figure 4C:
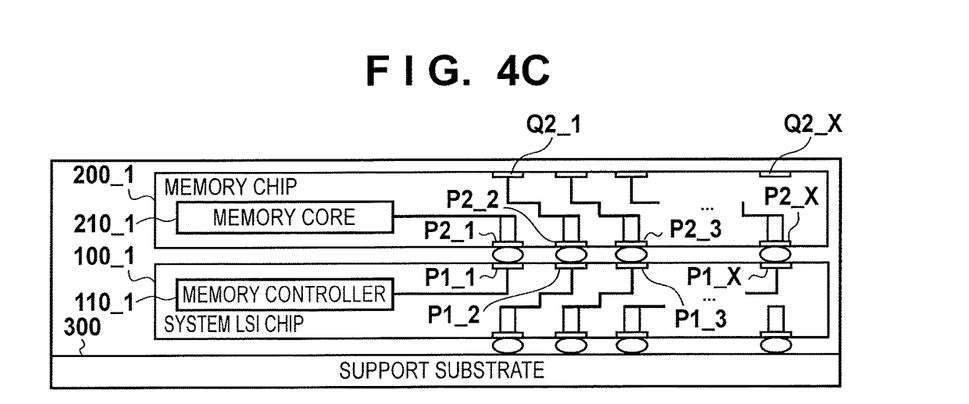

FIG. 4C exemplifies a configuration in which one system LSI chip 100 and one memory chip 200 in the stacked multiprocessor package shown in FIG. 3 are stacked. In FIG. 4C, the memory controller 110_1 and memory core 210_1 are connected as a pair.

Similarly, even when K (1≤K≤N) system LSI chips 100 and K memory chips 200 are stacked, respective pairs of memory controllers (K) and memory cores (K) are connected separately. As a result, the system LSI chips 100 and memory chips 200 can be diverted for even a package in which the numbers of stacked system LSI chips 100_N and memory chips 200_N are decreased to N or less in the multiprocessor package 10 configured by stacking N system LSI chips and N memory chips.

According to the above-described embodiments, when N (N is a natural number of 2 or more) system LSI chips 100 and N memory chips 200 are stacked, even if pairs of chips are connected separately and the number of stacked chips is changed, common chips can be diverted.

When the number of stacked chips in a multiprocessor package is changed in accordance with processing performance requested of a device to be mounted, common system LSI chips and memory chips can be diverted. Commonality of the manufacturing process can reduce the production cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-100708, filed May 10, 2013 which is hereby incorporated by reference herein in its entirety.

What is claimed is:

1. An integrated circuit device comprising:
N stacked first integrated circuit chips each configured to include a first circuit; and
N stacked second integrated circuit chips each configured to include a second circuit different from the first circuit,
wherein a predetermined first integrated circuit chip of the N stacked first integrated circuit chips and a redetermined second integrated circuit chip of the N stacked second integrated circuit chips are stacked to be directly adjacent to each other,
a first integrated circuit chip other than the predetermined first integrated circuit chip among the N first integrated circuit chips is not stacked to be directly adjacent to any of the N stacked second integrated circuit chips, and a second integrated circuit chip other than the predetermined second integrated circuit chip among the N second integrated circuit chips is not stacked to be directly adjacent to any of the N stacked first integrated circuit chips,
the first integrated circuit chip and the second integrated circuit chip have a first surface and a second surface respectively,
at least X (N≤X) first connection portions are arranged on each of the first surface of the first integrated circuit chip and the first surface of the second integrated circuit chip, and at least X second connection portions are arranged on each of the second surface of the first integrated circuit chip and the second surface of the second integrated circuit chip,
the first connection portions are arranged on the first surface and the second connection portions are arranged on the second surface to connect Yth (1≤Y≤X) first connection portions of one of two integrated circuit chips directly adjacent to each other among the N first integrated circuit chips and the N second integrated circuit chips and Yth second connection portions of another integrated circuit chips,
a first one of the first connection portions is connected to the first circuit in each of the N first integrated circuit chips, and a Zth (2≤Z≤X) one of the first connection portions is connected to a (Z−1)th one of the second connection portions via a through electrode formed in an inside of the first integrated circuit chip,
a first one of the second connection portions is connected to the second circuit in each of the N second integrated circuit chips, and a Zth (2≤Z≤X) one of the second connection portions is connected to a (Z−1)th one of the first cot action portions via a through electrode formed in an inside of the second integrated circuit chip, and a Yth one of the second connection portions in the predetermined second integrated circuit chip and a Yth one of the first connection portions in the predetermined first integrated circuit chip are connected, the first circuit of the predetermined first integrated circuit chip accesses the second circuit of the predetermined second integrated circuit chip through the first one of the first connection portions of the first predetermined circuit chip and the first one of the second connection portions of the predetermined second integrated circuit chip.

2. The device according to claim 1, further comprising a substrate, wherein one of the N first integrated circuit chips are stacked on the substrate.

3. The device according to claim 1, wherein a n-th (1≤n≤N) one of the N first integrated circuit chips from a reference surface, which is a surface on which the predetermined first integrated circuit chip and the predetermined second integrated circuit chip are directly adjacent to each other, and a n-th one of the second integrated circuit chip from the reference surface are paired, and each of the first circuits of the N first integrated circuit chips accesses the second circuit of the second integrated circuit chip in each pair.

4. An integrated circuit device comprising:

N (N is a natural number of not less than 2) stacked first integrated circuit chips ea configured to include a first circuit; and N stacked second integrated circuit chips each configured to include a second circuit different from the first circuit, wherein a predetermined first integrated circuit chip of the N stacked first integrated circuit chips and a predetermined second integrated circuit chip of the N stacked second integrated circuit chips are stacked to be directly adjacent to each other, a first integrated circuit chip other than the predetermined first integrated circuit chip among the N first integrated circuit chips is not stacked to be directly adjacent to any of the N stacked second integrated circuit chips, and a second integrated circuit chip other than the predetermined second integrated circuit chip among the N second integrated circuit chips is not stacked to be directly adjacent to any of the N stacked first integrated circuit chips, a n-th (1≤n≤N) one of the N first integrated circuit chips from a reference surface, which is a surface on which the predetermined first integrated circuit chip and the predetermined second integrated circuit chip are directly adjacent to each other, and a n-th one of the second integrated circuit chip from the reference surface are paired, each of the first integrated circuit chips and each of the second integrated circuit chips include connection terminals and through electrodes each penetrating an inside of the chip for connecting the first circuit of the first integrated circuit chip and the second circuit of the second integrated circuit chip in each pair such that the first circuit accesses the second circuit in each pair, and the connection terminals and the through electrodes in the first integrated circuit chip and the second integrated circuit chip are arranged to be symmetric with respect to the reference surface.

5. The device according to claim 4, wherein the first circuit includes a memory controller, and the second circuit includes a memory configured to be controlled by the memory controller.

6. The device according to claim 1, wherein the first integrated circuit chip is stacked on a substrate, and each of the first integrated circuit chip and the second integrated circuit chip has a first surface on a side near the substrate and a second surface on a side far from the substrate, X (X is a natural number) first connection terminals are arranged on the second surface of the first integrated circuit chip, a first one of the X first connection terminals is connected to the first circuit, and a Yth (2≤Y≤X; Y is a natural number) one of the X first connection terminals is connected to a (Y+1)th one of the X first connection terminals on the second surface of another first integrated circuit chip stacked to be adjacent to an upper layer which is a side far from the substrate, via the through electrode of the another first integrated circuit chip stacked to be adjacent to the upper layer, X second connection terminals are arranged on the first surface of the second integrated circuit chip, and a first one of the X second connection terminals is connected to the second circuit, and a Yth one of the X second connection terminals is connected to a (Y+1)th one of the X second connection terminals on the first surface of another second integrated circuit chip stacked to be adjacent to a lower layer which is a side near the substrate, via the through electrode of the another second integrated circuit chip stacked to be adjacent to the lower layer.

7. The device according to claim 6, wherein a Zth (Z≤X; Z is a natural number) one of the first connection terminals on the second surface of the first integrated circuit chip adjacent to the second integrated circuit chip and a Zth one of the second connection terminals on the first surface of the second integrated circuit chip adjacent to the first integrated circuit chip are connected.

* * * * *